(12) United States Patent
Erk et al.

(10) Patent No.: US 11,156,653 B2
(45) Date of Patent: Oct. 26, 2021

(54) COMBINED MONITORING DEVICE FOR INSULATION-RESISTANCE MONITORING AND PROTECTIVE-CONDUCTOR-RESISTANCE MONITORING OF A POWER SUPPLY SYSTEM

(71) Applicant: Bender GmbH & Co. KG, Gruenberg (DE)

(72) Inventors: Julian Erk, Ranstadt (DE); Michael Kammer, Hungen (DE); Winfried Moell, Laubach (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 17/029,137

(22) Filed: Sep. 23, 2020

(65) Prior Publication Data

US 2021/0096167 A1 Apr. 1, 2021

(30) Foreign Application Priority Data

Sep. 26, 2019 (DE) ...................... 10 2019 125 982.7

(51) Int. Cl.
*G01R 31/12* (2020.01)
*G01R 31/00* (2006.01)
(Continued)

(52) U.S. Cl.
CPC ....... *G01R 31/1272* (2013.01); *G01R 31/006* (2013.01); *G01R 31/40* (2013.01); *H02H 1/0007* (2013.01); *H02H 7/22* (2013.01)

(58) Field of Classification Search
CPC .. G01R 31/1272; G01R 31/006; G01R 31/40; G01R 27/025; G01R 31/52; G01R 27/18;
(Continued)

(56) References Cited

U.S. PATENT DOCUMENTS

| 2015/0255976 A1* | 9/2015 | Hackl | H02M 1/36 |
| | | | 361/47 |
| 2019/0250204 A1* | 8/2019 | Geiss | G01R 31/52 |
| 2021/0063464 A1* | 3/2021 | Xie | G01R 31/14 |

FOREIGN PATENT DOCUMENTS

| CN | 107064723 A | 8/2017 |
| CN | 109765494 A | 5/2019 |

(Continued)

*Primary Examiner* — Giovanni Astacio-Oquendo

(74) *Attorney, Agent, or Firm* — Dickinson Wright PLLC; Andrew D. Dorisio

(57) ABSTRACT

A combined monitoring device for insulation-resistance monitoring and protective-conductor-resistance monitoring in a power supply system includes a grounded power supply system and an ungrounded power supply system, the combined monitoring device having a coupling circuit for being coupled to one or several active conductors of the grounded power supply system via coupling points, the combined monitoring device including an active monitoring device with a first operating mode for monitoring an insulation resistance in an ungrounded network state of the power supply system and a second operating mode for monitoring a protective-conductor resistance in a grounded network state of the power supply system, the combined monitoring device having an evaluation unit switchable between the first and second operating modes as a function of the ungrounded or grounded network state and configured for testing the insulation resistance in the first operating mode and the protective-conductor resistance in the second operating mode.

8 Claims, 5 Drawing Sheets

(51) Int. Cl.
*G01R 31/40* (2020.01)
*H02H 1/00* (2006.01)
*H02H 7/22* (2006.01)

(58) Field of Classification Search
CPC .......... H02H 1/0007; H02H 7/22; H02H 3/17;
B60L 2250/10; B60L 3/0069
USPC ....................................... 324/551, 537, 500
See application file for complete search history.

(56) References Cited

FOREIGN PATENT DOCUMENTS

| | | |
|---|---|---|
| CN | 212989490 U | 4/2021 |
| DE | 102009001962 A1 | 10/2010 |
| DE | 102009054834 A1 | 6/2011 |
| DE | 102011084362 A1 | 10/2012 |

* cited by examiner

State of the art

COMBINED MONITORING DEVICE FOR INSULATION-RESISTANCE MONITORING AND PROTECTIVE-CONDUCTOR-RESISTANCE MONITORING OF A POWER SUPPLY SYSTEM

This application claims the benefit of German patent application no. 10 2019 125 982.7 filed on Sep. 26, 2019, the disclosure of which is incorporated by reference.

FIELD OF THE INVENTION

The invention relates to a combined monitoring device for insulation-resistance monitoring and protective-conductor-resistance monitoring in a power supply system which comprises a grounded power supply system and an ungrounded power supply system.

BACKGROUND

For operating electric consumers and operating means (in the following, the term consumer will be used as a superordinate term for electric consumers and operating means), suitable protective measures for protection against electric shocks—as, for example, defined in international standard IEC 61140—are to be taken.

With this in mind, protective measures are required while a consumer is in operation in an ungrounded network state on the one hand and in a grounded network state on the other hand when the consumer is operated with a rechargeable energy storage (accumulator/battery or capacitor) and dangerously high system voltages.

During operation in the ungrounded network state—e.g., while driving an electric vehicle—, there is no galvanic connection to an external power supply, and the electric installation in operation—e.g., the electrical system (battery grid) of an electric vehicle—can be viewed as a (mobile) ungrounded power supply system having the charged energy storage as a power supply.

Each ungrounded electric power supply system requires suitable insulation monitoring as a protective measure according to standard IEC 61557-8. According to this norm, an insulation monitoring device (IMD) is mandatory which continuously monitors insulation resistance (the resistance of the network to be monitored including the resistances of all consumers to ground connected thereto).

While the electric vehicle is in motion, insulation resistances are monitored via an insulation monitoring device installed in the electric vehicle, for example.

Insulation of a power supply system can be monitored either via an active or a passive measuring method.

In the active measuring method examined here, a measuring voltage (measuring signal) is impressed on the network to be monitored by means of a monitoring device functioning as an active insulation monitoring device. The measuring current resulting from the measuring voltage flows via the individual insulation resistances Rf+ and Rf− (for example in a direct-current network) and is returned via a ground connection (typically the protective conductor or, with an electric vehicle, the vehicle body) and is evaluated in the insulation monitoring device. If the insulation resistance calculated from the remeasured measuring current undershoots an insulation-resistance threshold (responding value) specified specifically for the installation, an alarm signal is triggered. This allows identifying symmetric insulation faults as well in contrast to the passive measuring method with which no separately generated measuring signal is supplied.

During operation in the grounded network state, for example while charging, the consumer is galvanically connected to the grounded power supply system. For this network configuration of the grounded network, an effective protective conductor (PE conductor), which connects all conductive touchable parts to the grounding system of the grounded power supply system, is to be installed as a protective measure against electric shocks according to standard IEC 60364-41-1.

The protective-ground connection is to be continuously monitored regarding its continuity. Should an insulation fault arise while operating in the grounded network state, the fault current resulting therefrom is discharged via the protective conductor and a dangerously high contact voltage is prevented. A condition in this instance is that the protective conductor is connected to the grounding system of the supplying power supply system at a sufficiently low impedance. To ensure this sufficiently low impedance, the protective conductor can be monitored by an adequate protective-conductor-resistance measurement or a protective-conductor-impedance measurement, the resistance/impedance being measured via a central grounding point and an active conductor (outer conductor or neutral conductor) of the grounded power supply system. Measurement of the protective-conductor resistance and/or impedance also specifically includes the active conductors as return conductors. This allows the presumption that the active conductors have low impedance. In the following, the entire loop resistance is therefore referred to when using the term PE resistance or protective-conductor resistance.

Monitoring the two safety-related network parameters insulation resistance and protective-conductor resistance using separate monitoring devices functioning individually from one another is known from the state of the art.

In the field of electric mobility, it is accordingly prescribed by standard IEC 61851-1 to use an additional signal contact CP (control pilot) as an auxiliary conductor for monitoring the protective conductor while the energy storage of the electric vehicle is charged. A disadvantage, however, is that no statement is made concerning the quality of the protective-conductor connection, that is the—as low as possible—electric resistance of the PE conductor.

The solutions known from the state of the art are disadvantageous in the regard that for monitoring the insulation and protective conductor, discrete, individually functioning monitoring devices are required in each instance. This results in high production and installation costs as well as a larger installation space. In particular for the fields of electric mobility, the signal contacts required per standard for monitoring the protective conductor must also be provided when connecting the consumer to the power supply system.

SUMMARY

The object of the present invention is therefore to devise a monitoring device which enables monitoring the protective-conductor resistance of a grounded power supply system and the insulation resistance of an ungrounded power supply system in an efficient manner regarding costs, energy consumption, installation space and weight.

According to the invention, this object is attained by a combined monitoring device for monitoring insulation resistances and protective-conductor resistances.

The disclosure describes a first embodiment (basic configuration) whose features are also part of the second and third embodiment.

The invention is based on the findings that the monitoring method to be used is applied between the active conductors of the corresponding power supply system and the protective-conductor system/ground/vehicle body for both monitoring tasks: on the one hand insulation monitoring while the consumer is disconnected from the supplying grounded power supply system (ungrounded network state/operation, for example while driving the electric vehicle) and on the other hand protective-conductor monitoring while being connected to the grounded power supply system (grounded network state/operation, for example while charging). In both operation cases, the resistance can be detected by impressing a measuring voltage: in ungrounded operation, the resistance to be detected is the insulation resistance, in grounded operation it is the protective-conductor resistance.

According to the state of the art, it is necessary to switch off the insulation monitoring device installed in the ungrounded power supply system, for example in the battery network of the electric vehicle, if this network is galvanically connected to a grounded power supply network. Otherwise, the insulation monitoring device would be triggered since the connection of the ungrounded network to the grounded network—for example by inserting a charging cable—would cause the ungrounded network to be converted to a grounded network and the measured insulation resistance would become zero.

Since the installed insulation monitoring device is consequently out of service in the grounded operation for detecting the insulation resistance, the insulation monitoring device can be used as an active monitoring device during grounded operation for monitoring the continuity (low impedance) of the protective conductor as envisioned by the invention.

These considerations lead to the subject matter of the invention as being a combined monitoring device which switches or is switched to the required protective function (either monitoring the insulation resistance or the protective-conductor resistance) according to the network to be monitored, i.e., adapted to a grounded/ungrounded network configuration, and consequently ensures protection against electric shocks across all functions in the grounded and ungrounded operation, for example while charging or in the operative driving operation.

For this purpose, the combined monitoring device disposes over a coupling circuit for being coupled to one or several active conductors of the grounded power supply system via coupling points and over an active monitoring device.

The active monitoring device has a first operating mode for monitoring an insulation resistance in an ungrounded network state of the power supply system and a second operating mode for monitoring a protective-conductor resistance in a grounded network state of the power supply system and comprises an evaluation unit, which can be switched between the first operating mode and the second operating mode as a function of the ungrounded or grounded network state and is configured for testing the insulation resistance in the first operating mode and for testing the protective-conductor resistance in the second operating mode.

By combining both uses in a combined monitoring device or by using a device which realizes this combined monitoring device in multiple ways, costs, energy consumption and weight can be reduced in an advantageous manner and fewer requirements to the installation space exist. In instances where hitherto two monitoring devices functioning separately from and independently to each other are still required, requirements to electrical safety can be met by only one (combined) device.

These factors play an increasingly more important role in the automobile industry, for example. The combined monitoring device can serve another market sector and possibly generate a competitive advantage.

With electric mobility in mind, another advantage comes to light owing to which no additional signal contacts for monitoring the protective-conductor resistance are required. In addition to charging stations and home charging stations, the electric vehicle can be consequently charged at nearly all common electric hook-ups.

When using the combined monitoring device, it is of no importance whether the grounded power supply network is one according to IEC standards (50 Hz: AC 230 V; 3 AC 400 V; 3 NAC 400 V/230 V) or UL standards (60 Hz: AC 120 V; 2 AC 240 V).

The combined monitoring device according to the invention can generally be used in all application environments in which a grounded network can be switched to an ungrounded network in a targeted manner and vice versa. This can generally take place in all possible ungrounded power supply systems, such as uninterrupted power supplies, microgrids or in the field of electric mobility.

In another embodiment, the active monitoring device comprises a switch-signal input for switching between the first operating mode and the second operating mode by means of an external switch signal.

The act of switching by means of the external switch signal produced manually or automatically therefore takes place as a function of the monitoring task and consequently depends on the network state of the power supply system to be monitored.

Advantageously, the evaluation unit is configured for testing whether a settable insulation-resistance threshold is being undershot in the first operating mode and for testing whether a settable protective-conductor-resistance threshold is being exceeded in the second operating mode.

Depending on the monitoring task, a settable resistance threshold is interpreted as either an insulation-resistance threshold or a protective-conductor-resistance threshold in the evaluation unit and is tested on whether either threshold has been undershot or exceeded by the identified insulation resistance or protective-conductor resistance.

Furthermore, the combined monitoring device comprises a switching device which is connected upstream of the coupling points for disconnecting the active conductors of the grounded power supply system so as to prevent the grounded power supply system from being operated in the event that an impermissibly low insulation resistance is detected in the ungrounded power supply system.

According to a second embodiment, the combined monitoring device advantageously comprises a first load relay which is connected upstream of the coupling points—with respect to the direction determined by the inputs and outputs of the combined monitoring device—for disconnecting the active conductors of the grounded power supply system, and a second load relay which is connected downstream of the coupling points for disconnecting the active conductors of the grounded power supply system.

The first load relay and the second load relay enable alternatingly operating the network to be tested on the combined monitoring device while simultaneously disconnecting the other network. Ond disconnecting the network to be tested is consequently determined by the switch state of the first and second load relay.

According to an advantageous third embodiment, the combined monitoring device comprises a load relay for disconnecting the active conductor of the grounded power supply system and a changeover relay which connects the active conductors to the coupling circuit upstream of the load relay via first coupling points for monitoring the grounded power supply system or connects the active conductors to the coupling circuit downstream of the load relay via second coupling points for monitoring the ungrounded power supply system.

Alternatively to the design of the second embodiment having two load relays, only one load relay can operate the network to be tested and disconnect the remaining network in conjunction with a changeover relay. For this purpose, the changeover relay is connected to the active conductors of the ungrounded power supply system via first/second coupling points upstream/downstream of the load relay so as to connect the corresponding network to the coupling circuit.

Compared to the embodiment having two load relays, using a changeover relay proves to be an even more favorable alternative with regard to costs and installation space since the load relay has to switch the load current in contrast to the changeover relay.

Preferably, the combined monitoring device comprises a voltage measuring device for measuring a switch voltage or several switch voltages in the grounded power supply system and for automatically switching the evaluation unit—as well as the superordinate active monitoring device—to the second operating mode for monitoring the protective-conductor resistance if the switch voltage or a switch voltage derived from combining several switch voltages exceeds a settable switch-voltage threshold, and to the first operating mode for insulation monitoring when the switch-voltage threshold is undershot.

Complementarily to the switching option via the switch-signal input by means of an external switch signal, the operating mode can be switched automatically to the second operating mode PE monitoring internally in the combined monitoring device. For this purpose, the voltage measuring device measures at least one switch voltage in the supplying grounded power supply system. If the measured switch voltage or a switch voltage derived from combining several switch voltages exceeds a settable switch-voltage threshold, it can be assumed that the grounded power supply system is connected to its network voltage, and the voltage measuring device triggers the evaluation unit to switch to the second operating mode PE monitoring. If the switch-voltage threshold is undershot directly after, the evaluation unit preferably switches back to the first operating mode insulation monitoring after a settable delay time (hysteresis).

The corresponding measured switch voltage is a conductor-conductor voltage via measuring points between two arbitrary active conductors of the grounded power supply system or a conductor-ground voltage via measuring points between an arbitrary active conductor and the protective conductor of the grounded power supply system.

BRIEF DESCRIPTION OF THE FIGURES

Further advantageous embodiment features are derived from the following description and the drawings which describe preferred embodiments of the invention using examples. In the following.

DETAILED DESCRIPTION

Figure 1:
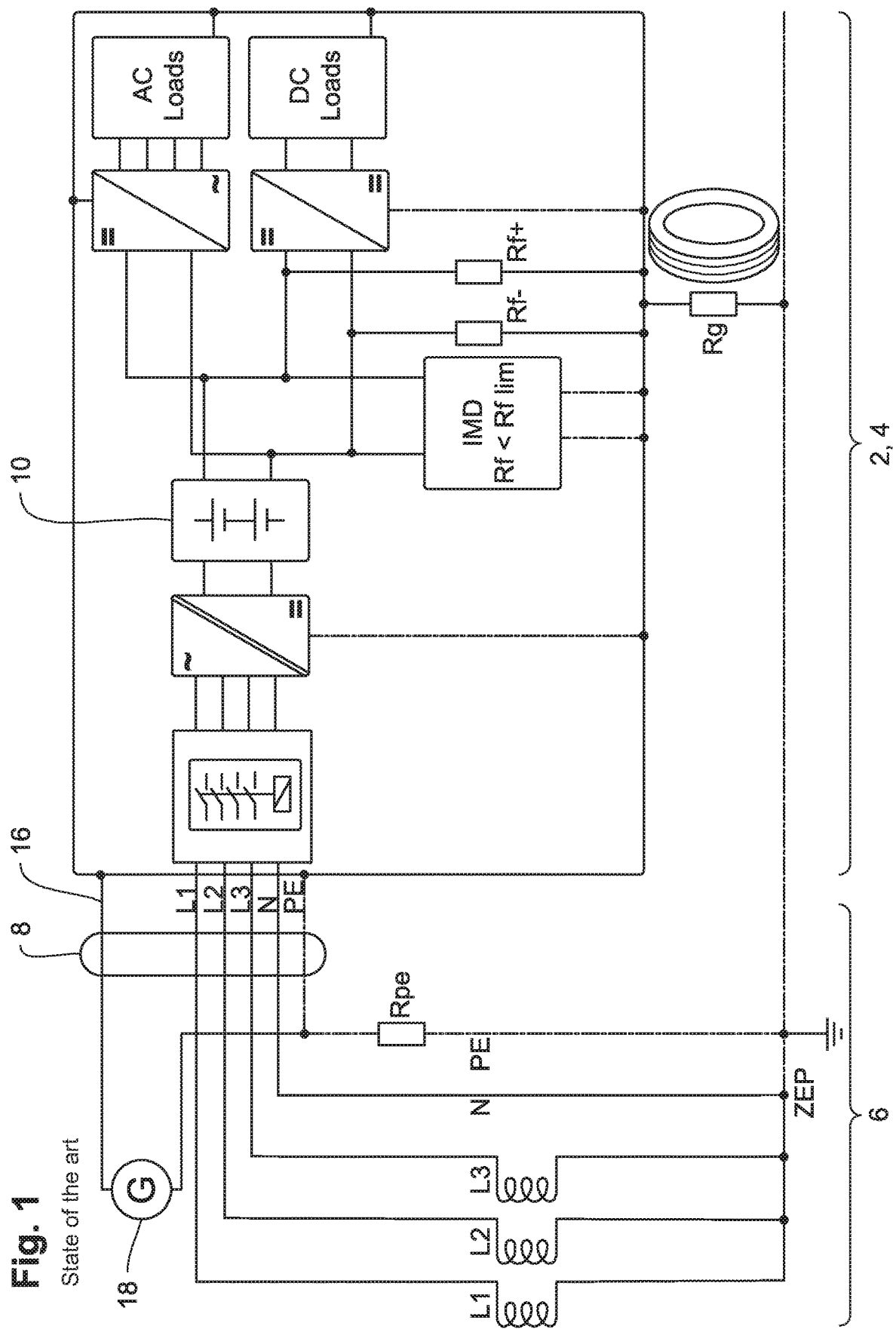
FIG. 1 shows a monitoring system for insulation-resistance monitoring and protective-conductor-resistance monitoring according to the state of the art.

Using a functional block diagram, FIG. 1 shows a structure of a monitoring system known from the state of the art for insulation-resistance monitoring and protective-conductor-resistance monitoring.

In the grounded network state, ungrounded power supply system 2 (ungrounded network) is connected as a battery network 4 to a grounded power supply network 6 (grounded network) via a connection cable 8. It is visible that battery network 4 having chargeable electric energy storage 10 (battery) is grounded by means of this connection via a central grounding point ZEP and is converted to a consumer of grounded power supply system 6. A casing resistance Rg of the consumer casing against ground (central grounding point ZEP) is typically to be considered as high-impedance.

As an example, grounded power supply system 6 is configured as a supplying, three-phase network having active conductors L1, L2, L3 and N and a protective conductor PE (PE conductor). Protective conductor PE has a protective-conductor resistance Rpe. The continuity of protective conductor PE must be ensured, for which reason protective-conductor resistance Rpe must be of sufficiently low impedance.

An additional signal contact 16, as prescribed in the field of electromobility by standard IEC 61851-1, for example, serves for protective-conductor monitoring during operation in the grounded network state. Via this signal contact 16, a defined signal 18 is sent to the supplied consumer (e.g., the electric vehicle) from the supplying infrastructure (e.g., a charging station of grounded power supply system 6) and returned via PE conductor PE. The presence of PE conductor PE is tested by means of the returned signal. In the example of electromobility, however, further data is exchanged via this signal contact and the PE conductor. What proves to be disadvantageous is that no conclusion can be made regarding the quality of the protective-conductor resistance Rpe as only the presence of protective conductor PE ("PE is present" or "PE is not present") can be determined.

Insulation resistance is monitored in the ungrounded network state during operation via a discretely disposed active insulation monitoring device 14 (IMD).

Thus, according to the state of the art, two devices (one for monitoring the protective-conductor resistance and another for monitoring the insulation resistance) having the disadvantages arising therefrom concerning costs, energy consumption and installation space are required.

Figure 2:
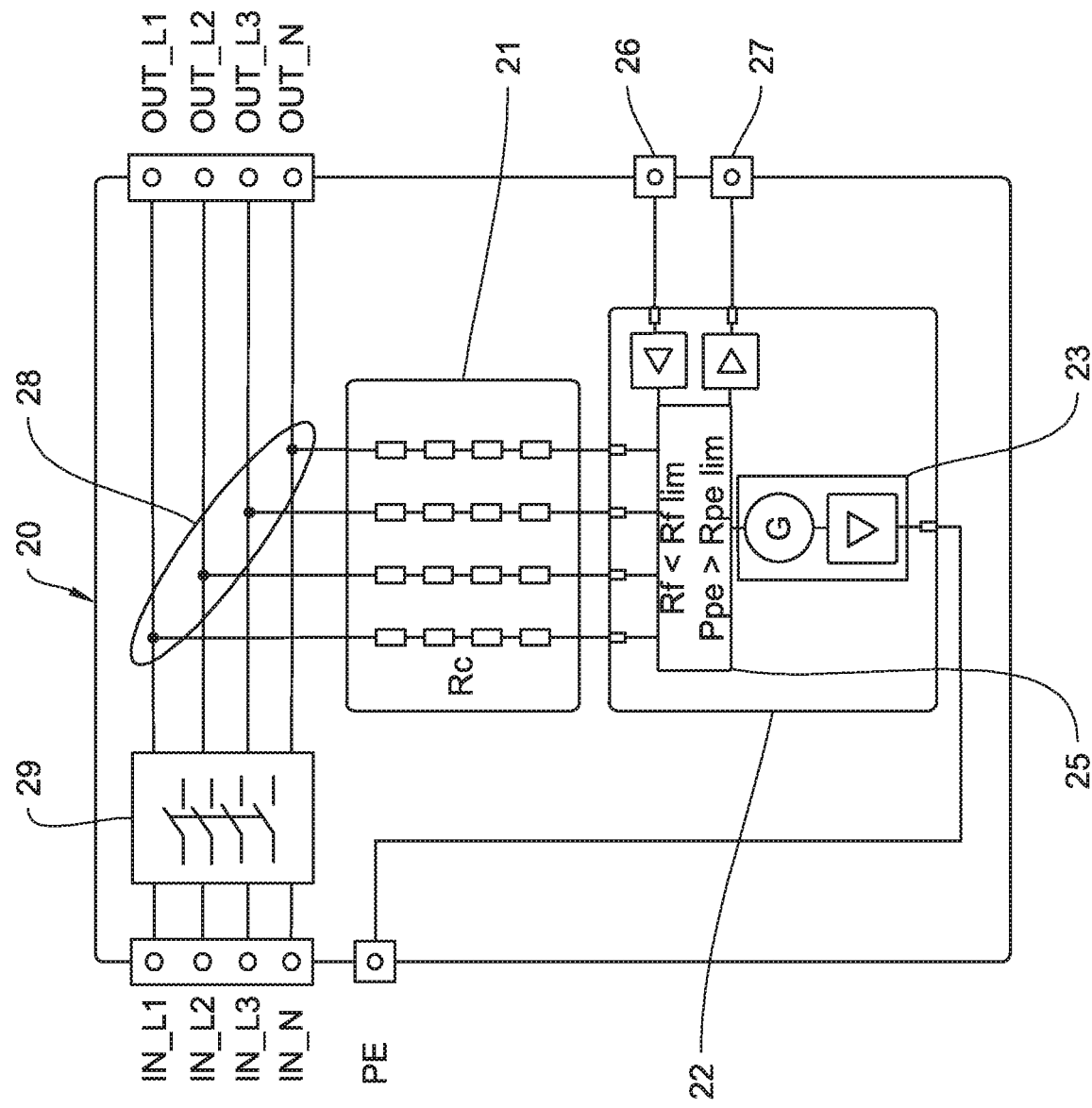
FIG. 2 shows a combined monitoring device according to the invention as a first embodiment (basic configuration)
Figure 3:
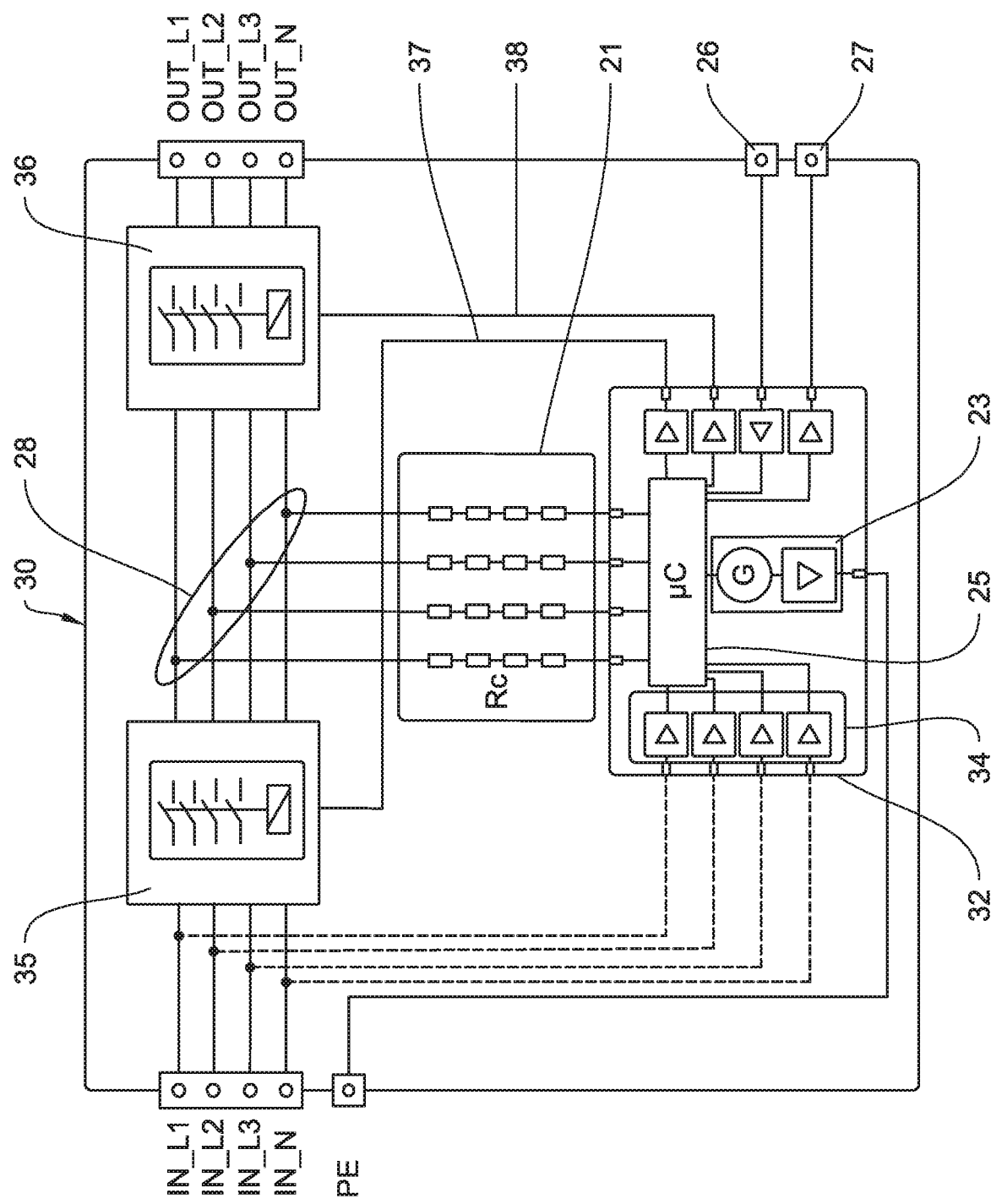
FIG. 3 shows a second embodiment of a combined monitoring device according to the invention having voltage measuring and two load relays.
Figure 4:
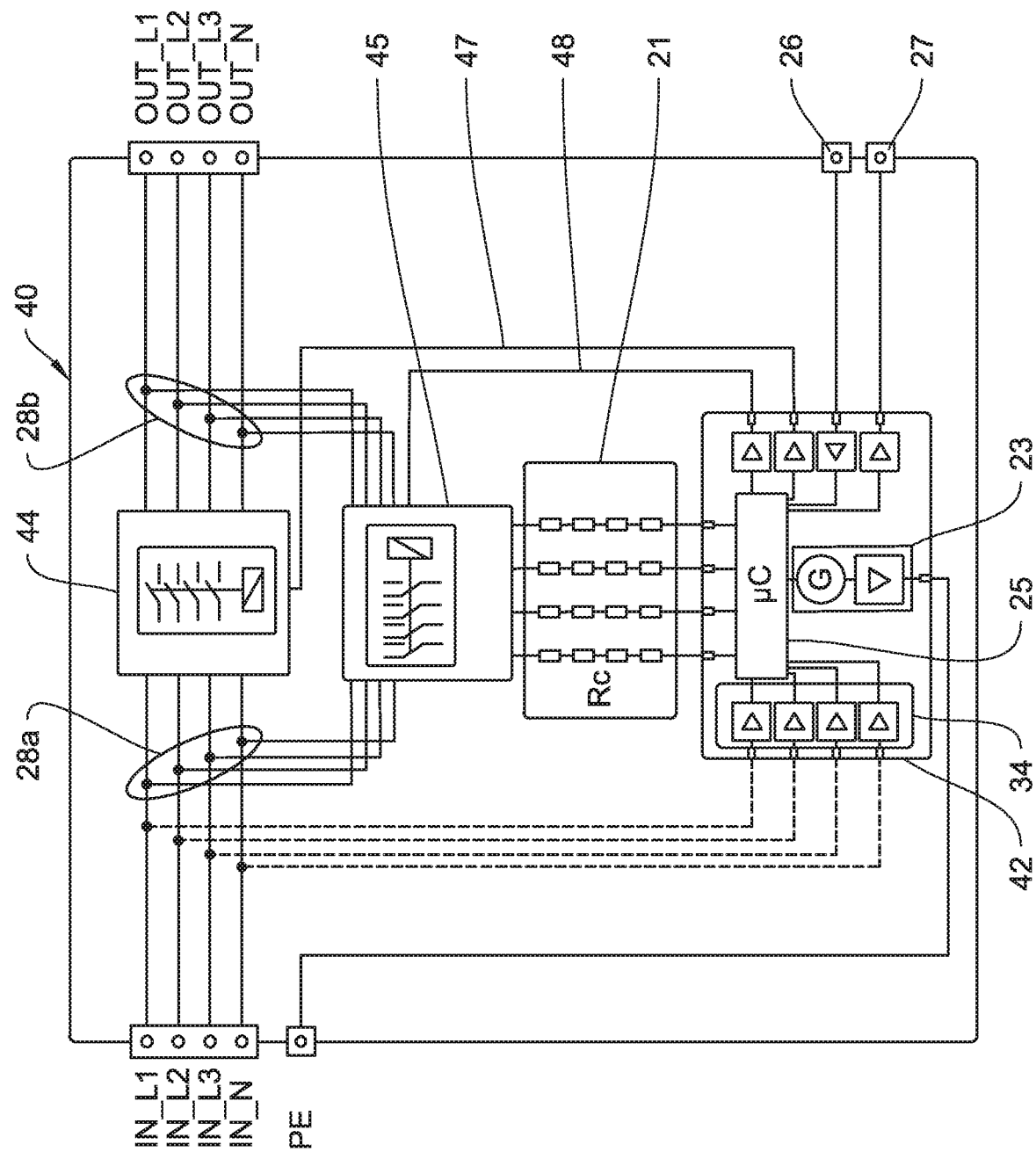
FIG. 4 shows a third embodiment of a combined monitoring device according to the invention having voltage measuring, a load relay and a changeover relay.
Figure 5:
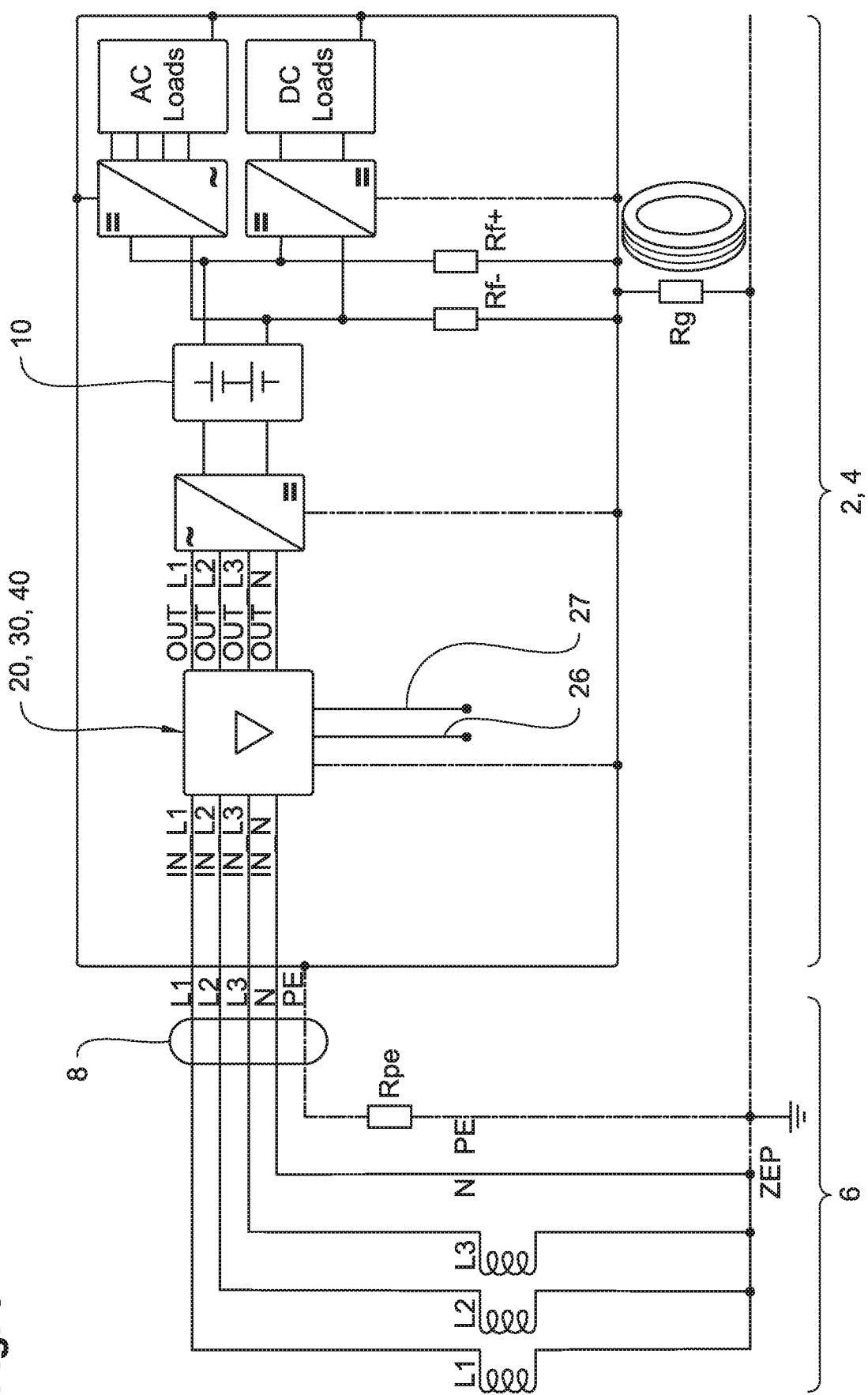
FIG. 5 shows a use of the combined monitoring device according to the invention based on the state of the art.

The following FIGS. 2 to 4 show in functional block diagrams three embodiments of a combined monitoring device 20, 30, 40 according to the invention which can be connected together with grounded power supply system 6 and ungrounded power supply system 2, 4 according to FIG. 5.

Combined monitoring devices 20, 30, 40 described above each comprise a coupling circuit 21 having coupling resistances Rc for being coupled to active conductors L1, L2, L3, N of grounded power supply system 6 via coupling points 28. Combined monitoring devices 20, 30, 40 each further comprise an active monitoring device 22, 32, 42, thus are based upon an active measuring method during which a measuring voltage is superimposed on ungrounded network 2 by means of a symbolically illustrated measuring-voltage source 23, and during which the resulting measuring current is detected via a voltage drop at a measuring resistance within active monitoring device 22, 32, 42 for determining insulation resistance Rf or, in an advanced function according to the invention, for determining protective-conductor resistance Rpe.

Functionally illustrated coupling circuit 21 can also be a structural part of active monitoring device 22, 32, 42.

Active monitoring devices 22, 32, 42 each comprise an evaluation unit 25 which is configured so as to be switchable between a first operating mode for identifying whether an insulation-resistance threshold Rflim is being undershot by detected insulation resistance Rf and a second operating mode for identifying whether protective-conductor-resistance threshold Rpelim is being exceeded by detected protective-conductor resistance Rpe.

The difference between the two operating modes can be summed up by means of the following characteristics:
insulation monitoring mode (for an ungrounded network):
  high resistance value (of the detected insulation resistance)>good state
  low resistance value (of the detected insulation resistance)>bad state
  alarm>when undershooting insulation-resistance threshold Rflim
PE monitoring mode (for a grounded network):
  high resistance value (of the detected protective-conductor resistance)>bad state
  low resistance value (of the detected protective-conductor resistance)>good state
  alarm signal>when exceeding protective-conductor-resistance threshold Rpelim,
the threshold between high and low resistance values being specified by corresponding threshold Rflim, Rpelim according to the specifications of each installation.

For switching the operating mode, it is therefore required to merely "reverse" the decision-making logic of evaluation unit 25 and to adjust the thresholds as a function of the network configuration and the monitoring task resulting therefrom.

With all three embodiments of combined monitoring device 20, 30, 40, the operating modes can be switched via a switch-signal input 26 of active monitoring device 22, 32, 42 by means of an external switch signal; moreover, with embodiments 30, 40, as illustrated in FIGS. 3 and 4, the operating modes can be switched automatically via a voltage measuring device 34.

For sending the alarm signal, evaluation unit 25 comprises at least one alarm-signal output 27. Alarm-signal output 27 can, for example, switch an external relay in order to disconnect battery network 4 galvanically from connected grounded power supply system 6. Several alarm-signal outputs 27 pose a further possibility which can be configured as analog and digital and represent different alarm levels (pre-alarm, main alarm), for example.

In FIG. 2, combined monitoring device 20 is schematically illustrated in a first embodiment. The all-pole coupling in this instance (coupling to all active conductors L1, L2, L3, N) via coupling resistances Rc is meant as an example. Generally, a one-pole coupling is also sufficient as it is for the other embodiments of combined monitoring device 30, 40 in FIGS. 3 and 4. It is then irrelevant for measuring the protective-conductor resistance whether the one-pole coupling is on an outer conductor L1, L2, L3 or the neutral conductor N. For voltage measurement and the accompanied automatic switch, however, it must be ensured that the combined monitoring device 20 is coupled to an outer conductor L1, L2, L3.

In this first embodiment, the operating mode is switched exclusively by an external switch signal via switch-signal input 26.

For disconnecting active conductors L1, L2, L3, N of grounded power supply system 6, a switch device 29 is connected upstream of coupling points 28 so as to prevent grounded power supply system 6 from being operated in the event that an impermissibly low insulation resistance Rf is detected in ungrounded power supply system 2, 4.

FIG. 3 shows combined monitoring device 30 according to the invention in a second embodiment having a symbolically illustrated voltage measuring device 34, a first load relay 35 and a second load relay 36.

First load relay 35 is connected upstream of coupling points 28 for disconnecting the active conductors of grounded power supply system 6 with respect to the direction determined by the inputs and outputs of combined monitoring device 30. Second load relay 36 is connected downstream of coupling points 28 for disconnecting the active conductors of grounded power supply system 6.

The operating mode is switched automatically by measuring voltage by means of voltage measuring device 34, but can also be triggered by the external switch signal as in the first embodiment.

If a voltage which exceeds a settable switch-voltage threshold is measured between two arbitrary conductors L1, L2, L3, N when the switching is caused by voltage measuring, second load relay 36 opens up and first load relay 35 closes. As a consequence, ungrounded network 2 is disconnected from active monitoring device 32 and active monitoring device 32 is coupled to grounded power supply system 6 via coupling circuit 21 for protective-conductor monitoring. Evaluation unit 25 works in the PE monitoring mode and detects protective-conductor resistance Rpe. If protective-conductor resistance Rpe undershoots a previously defined protective-conductor-resistance threshold and if insulation resistance Rf previously detected before opening second load relay 36 exceeds a defined insulation-resistance threshold Rflim, second load relay 36 closes again and ungrounded power supply system 2, 4 connected to connections OUT_x is thus grounded.

If a voltage below the switch-voltage threshold is measured, first load relay 35 is opened and the insulation monitoring mode is reactivated since it can be assumed that the connection to grounded power supply system 6 has been interrupted. In the insulation monitoring mode, an alarm signal is given via alarm-signal output 27 when insulation-resistance threshold Rflim is undershot in order to cause battery 10 (FIG. 5) to be switched off, for example.

The switch-voltage threshold can generally be set to any threshold which corresponds to the safety objective and is specific to the installation and can have a safety extra-low voltage of 50 V, for example, with regard to the protective measure.

In the PE monitoring mode, first load relay 35 is also opened in addition to the alarm signal being sent out. By opening first load relay 35, an ungrounded network 4 is now available again. In comparison to the first embodiment, the second embodiment thus brings the advantage that in the event of a fault—when exceeding protective-conductor-resistance threshold (Rpelim)—, the power electronics following in the consumer is galvanically disconnected from power supply network 6.

Starting from evaluation unit 25, first/second load relay 35/36 is controlled by active monitoring device 32 by means of a first/second control-signal line 37/38.

FIG. 4 shows combined monitoring device 40 according to the invention in a third embodiment.

In this embodiment, combined monitoring device 40 works according to the same principles as the second embodiment, except that second load relay 36 (FIG. 3) is not required and network 2, 4 (ungrounded) or 6 (grounded) to be tested is alternatingly operated by a (central) load relay 44 in conjunction with a changeover relay 45.

According to the corresponding operating mode, coupling resistances Rc of coupling circuit 21 are coupled upstream of load relay 44, illustrated on the left-hand side of load relay 44 via first coupling points (28a), for PE monitoring or downstream of load relay 44, illustrated on the right-hand side of load relay 44 via second coupling points (28b), for insulation monitoring. The indication of an alarm signal is given in the same manner as in the second embodiment.

The advantage received by leaving out second load relay 36 (FIG. 3) regarding installation space, power loss and costs becomes even more apparent when active monitoring device 42 is coupled with one pole.

Starting from evaluation unit 25, load relay 44/changeover relay 45 is controlled by active monitoring device 32 by means of control-signal line 47/alternating-signal line 48.

In FIG. 5, a use of combined monitoring device 20, 30, 40 is shown using the example of a consumer which is not galvanically disconnected and has an integrated, chargeable electric energy storage 10, the combined monitoring device 20, 30, 40 being available in one of the three embodiments 20, 30, 40 for shared insulation-resistance and loop-resistance monitoring and being able to be connected to active conductors L1, L2, L3, N via connections IN_L1, IN_L2, IN_L3; IN_N on the input side and via connections OUT_L1, OUT_L2, OUT_L3, OUT_N on the output side.

While being operated in the ungrounded network state—for example while driving the electric vehicle—, insulation resistance Rf of ungrounded battery network 4 formed by individual insulation resistances Rf+ and Rf− is monitored with respect to a conductive casing of the consumer, e.g., the vehicle body.

In the grounded network state—for example, while charging the electric vehicle—, however, ungrounded battery network 4 turns into a consumer of typically grounded power supply network 6 via the connection not galvanically disconnected so that a complete grounded network is yielded. This is an operating means of protective class 1 according to IEC 60140. This means that the protection against electric shocks must be ensured by the connection of PE conductor PE (i.e., in this case the conductive casing of the consumer) to the grounded protective electrical potential of grounded power supply network 6. In this instance, the state of protective conductor PE (i.e., its low impedance) is critical to the effectiveness of the protective measure.

Owing to the combined monitoring device according to the invention, the low-impedance connection to the ground potential (central grounding point ZEP) can be determined without an additional auxiliary conductor, and furthermore the actual resistance value of protective-conductor resistance Rpe can be determined—for example, in comparison to electric mobility—by measuring the loop resistance of L1, L2, L3 and N (depending on the type and number of active conductors L1, L2, L3, N of supplying grounded power supply system 6 and the type of coupling) in the grounded operation via protective-conductor resistance Rpe back to the vehicle.

The invention claimed is:

1. A combined monitoring device (20, 30, 40) for insulation-resistance monitoring and protective-conductor-resistance monitoring in a power supply system which comprises a grounded power supply system (6) and an ungrounded power supply system (2, 4), the combined monitoring device (20, 30, 40) comprising:
a coupling circuit (21) for being coupled to one or several active conductors (L1, L2, L3, N) of the grounded power supply system (6) via coupling points (28), comprising an active monitoring device (22, 32, 42) which comprises a first operating mode for monitoring an insulation resistance (Rf) in an ungrounded network state of the power supply system (2, 4, 6) and a second operating mode for monitoring a protective-conductor resistance (Rpe) in a grounded network state of the power supply system (2, 4, 6), and comprising an evaluation unit (25) which is switchable between the first operating mode and the second operating mode as a function of the ungrounded or grounded network state and is configured for testing the insulation resistance (Rf) in the first operating mode and for testing the protective-conductor resistance (Rpe) in the second operating mode.

2. The combined monitoring device (20, 30, 40) according to claim 1, wherein the active monitoring device (22, 32, 42) comprises a switch-signal input (26) for switching between the first operating mode and the second operating mode by means of an external switch signal.

3. The combined monitoring device (20, 30, 40) according to claim 1, wherein the evaluation unit (25) is configured for testing in the first operating mode whether a settable insulation-resistance threshold (Rflim) has been undershot and for testing in the second operating mode whether a settable protective-conductor-resistance threshold (Rpelim) has been exceeded.

4. The combined monitoring device (20) according to claim 1, further including a switch device (29) which is connected upstream of the coupling points (28) for disconnecting the active conductors (L1, L2, L3, N) of the grounded power supply system (6) so as to prevent the grounded power supply system (6) from being operated in the event that an impermissibly low insulation resistance (Rf) is determined in the ungrounded power supply system (2, 4).

5. The combined monitoring device (30) according to claim 1, further including a first load relay (35) which is connected upstream of the coupling points (28) for disconnecting the active conductors (L1, L2, L3, N), and a second load relay (36) which is connected downstream of the coupling points (28) for disconnecting the active conductors (L1, L2, L3, N).

6. The combined monitoring device (30, 40) according to claim 5, further including a voltage-measuring device (34) for measuring one changeover voltage or several changeover voltages in the grounded power supply system (6) and for automatically switching the evaluation unit (25) to the second operating mode so as to monitor the protective-conductor resistance (Rpe) if the changeover voltage or a changeover voltage which has been derived from the combination of several changeover voltages exceeds a settable changeover-voltage threshold and switches back to the first operating mode for insulation monitoring when the changeover-voltage threshold is undershot.

7. The combined monitoring device (30, 40) according to claim 6, wherein the corresponding measured changeover voltage is a conductor-conductor voltage via measuring points between two arbitrary active conductors (L1, L2, L3, N) of the grounded power supply system (6) or a conductor-ground voltage via measuring points between an arbitrary active conductor (L1, L2, L3, N) and the protective conductor (PE) of the grounded power supply system (6).

8. The combined monitoring device (40) according to claim 1, further including a load relay (44) for disconnecting the active conductors (L1, L2, L3, N), and a changeover relay (45) which connects the active conductors (L1, L2, L3, N) to the coupling circuit (21) upstream of the load relay (44) via first coupling points (28*a*) so as to monitor the grounded power supply system (6) or connects the active conductors (L1, L2, L3, N) to the coupling circuit (21) downstream of the load relay (44) via second coupling points (28*b*) so as to monitor the ungrounded power supply system (2, 4).

\* \* \* \* \*